United States Patent
Nakamura et al.

(10) Patent No.: US 8,446,091 B2
(45) Date of Patent: May 21, 2013

(54) COLOR CONVERSION FILTER AND MANUFACTURING METHOD OF THE ORGANIC EL DISPLAY

(75) Inventors: Hideyo Nakamura, Tokyo (JP); Naoyuki Kanai, Tokyo (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/613,280

(22) Filed: Sep. 13, 2012

(65) Prior Publication Data

US 2013/0038205 A1    Feb. 14, 2013

Related U.S. Application Data

(62) Division of application No. 12/452,045, filed as application No. PCT/JP2008/054140 on Mar. 7, 2008, now Pat. No. 8,304,265.

(30) Foreign Application Priority Data

Sep. 19, 2007  (JP) ................................. 2007-242542
Jan. 7, 2008  (JP) ................................. 2008-000647

(51) Int. Cl.
  *H01J 1/62*   (2006.01)
(52) U.S. Cl.
  USPC ........................................... 313/504; 313/506
(58) Field of Classification Search
  USPC ................. 313/466, 473, 474, 112, 498, 501, 313/504, 506, 512
  See application file for complete search history.

(56) References Cited

U.S. PATENT DOCUMENTS

| | | | |
|---|---|---|---|
| 5,703,432 A | 12/1997 | Jeong | |
| 7,368,862 B2 * | 5/2008 | Pelrine et al. | 310/365 |
| 7,986,087 B2 | 7/2011 | Asano et al. | |
| 2004/0233139 A1 | 11/2004 | Asano et al. | |
| 2007/0024186 A1 | 2/2007 | Chen et al. | |
| 2007/0200492 A1 | 8/2007 | Cok et al. | |
| 2008/0001528 A1 | 1/2008 | Eida | |
| 2009/0230853 A1 | 9/2009 | Kanai | |

FOREIGN PATENT DOCUMENTS

| | | |
|---|---|---|
| CN | 101029945 A | 9/2007 |
| JP | 2000-230172 A | 8/2000 |
| JP | 2002-075643 A | 3/2002 |
| JP | 2003-217859 A | 7/2003 |
| JP | 2003-229261 A | 8/2003 |
| JP | 2003243172 A | 8/2003 |
| JP | 2004-094236 A | 3/2004 |
| JP | 2004-253179 A | 9/2004 |
| JP | 2005-003854 A | 1/2005 |
| JP | 2005-310535 A | 11/2005 |
| JP | 2005-353550 A | 12/2005 |
| JP | 2006-032010 A | 2/2006 |
| JP | 2006-073450 A | 3/2006 |
| JP | 2006-267524 A | 10/2006 |
| JP | 2006-294454 A | 10/2006 |
| KR | 2001002253 A | 1/2001 |

* cited by examiner

*Primary Examiner* — Vip Patel
(74) *Attorney, Agent, or Firm* — Rabin & Berdo, P.C.

(57) ABSTRACT

A process for producing a color conversion filter uses an ink jet recording method, which can form a color conversion layer at a desired position without the need to separately form partition walls, and a process for producing an organic EL display. The process for producing a color conversion filter includes forming a black matrix having a plurality of opening parts on a transparent substrate, forming at least two types of color filter layers independently of each other on a black matrix to which dissimilar color filter layers are adjacent, to form a partition wall, at least two of the color filter layers being superimposed on top of each other, and forming a color conversion layer by ink jet recording onto at least one of the color filter layers.

12 Claims, 8 Drawing Sheets

COLOR CONVERSION FILTER AND MANUFACTURING METHOD OF THE ORGANIC EL DISPLAY

This is a Divisional of U.S. application Ser. No. 12/452,045, filed on May 7, 2010, and allowed on Aug. 10, 2012, the subject matter of which is incorporated herein by reference.

TECHNICAL FIELD

This invention relates to a method of forming a color conversion filter. In particular, this invention relates to a method for manufacturing a color conversion filter including a color conversion layer having a high-resolution pattern. Also, this invention relates to a method for manufacturing an organic EL display, which includes the above-described color conversion filter, and which outputs at least one color from among the three primary colors through a color conversion layer.

BACKGROUND ART

In recent years in the display field, multicolor emissive displays have been developed which are capable of multicolor or full-color display. In particular, considerable efforts have been made to develop high-resolution multicolor emissive EL displays, which can make effective use of the characteristics of organic EL elements. This is because in organic EL elements high current densities can be obtained, at low applied voltages, and consequently high brightness and high emission efficiency can be realized.

Of these, color conversion-type organic EL displays have attracted attention. A color conversion-type organic EL display generally passes light, emitted from an organic EL element through a color conversion layer and a color filter layer in sequence, to emit light, having a prescribed wavelength to the outside. Here, a color conversion layer has the functions of absorbing light emitted from the organic EL element in the near-infrared to the visible range, performing wavelength distribution conversion, and radiating visible light comprising light at different wavelengths. A color filter layer has the functions of blocking light, at specific wavelengths, and improving the color purity of visible light that has passed through a color conversion layer.

With respect to organic EL displays comprising a color conversion layer and a color filter layer, the following technologies have been disclosed as examples for realizing multicolor light emission.

For example, an organic EL display has been proposed, having a plurality of independently controllable organic EL elements, each comprising a transparent substrate, a color filter layer formed by evaporation deposition of a pigment and/or organic dye, a fluorescent conversion layer (equivalent to a color conversion layer) which performs conversion into light of a prescribed wavelength, and at least one organic light emission layer between two electrodes at least one of which is transparent (see Patent Document 1: Japanese Patent Application Laid-open No, 2002-75643). In this technology, the fluorescent light emission layer comprises at least one type of color conversion material, which absorbs light at short wavelengths and performs conversion into light at long wavelengths.

Further, as a method of forming a fluorescent conversion layer or color conversion layer, a method in which a liquid comprising a color conversion material dispersed in a resin is applied, and a method in which a color conversion material is deposited by evaporation deposition, sputtering, or another dry process, have been disclosed (see Patent Document 1, Patent Document 2: Japanese Patent Application Laid-open No 2003-217859, and Patent Document 3: Japanese Patent Application Laid-open No. 2000-230172).

In general, when realizing a high-resolution color display using a color conversion-type organic EL display, it is effective to raise the concentration of the color conversion material in the color conversion layer, increase the absorptance of absorbed light in the color conversion layer, and obtain a high converted light intensity.

However, if the concentration of color conversion material is raised, a phenomenon called concentration quenching occurs, in which energy absorbed from light emitted from the organic EL element is repeatedly transferred between molecules in the color conversion material, and there is deactivation of the color conversion material, without accompanying light emission. In order to suppress concentration quenching, it is essential that the color conversion material be dissolved or dispersed in some medium to lower the concentration (see Patent Document 3). On the other hand, if the concentration of the color conversion material is lowered, absorptance of the light to be absorbed is reduced, and adequate converted light intensity is not obtained.

With respect to this problem, the film thickness of the color conversion layer is being increased to raise the absorptance and maintain color conversion efficiency. When a color conversion layer is used with the film thickness increased to approximately 10 μm in this way, there exist such problems as breakage of lines in electrode patterns at step portions, the difficulty of attaining high resolution, and, when combined with organic EL elements, changes in the properties of the organic EL layer due to residual water content or solvent in the color conversion layer, display defects, and similar. In addition, from the standpoint of reducing dependence on the viewing angle, increasing the film thickness of the color conversion film is not preferable.

In response to such conflicting demands, technology has been proposed for using evaporation deposition to form a host-guest color conversion layer having a film thickness of 2000 nm or less, as technology to provide a color conversion layer from which adequate converted light intensity is obtained without increasing the film thickness.

When forming the color conversion layer by evaporation deposition, the color conversion layer is formed over the entirety of the layer serving as the base, and so separation of the regions emitting light in each of the three primary colors (red, green, and blue) is not possible. Hence some means must be employed to form a color conversion layer having a fine pattern (subpixels) corresponding to specific primary colors. An application method using a metal mask is known as an example of method of forming a thin film in a pattern in evaporation deposition (see Patent Document 1).

However, the properties of a metal mask necessitate penetrating openings, and so in order to secure strength for the metal mask, adequate intervals between adjacent openings, that is, frame width, must be secured. Consequently there is a limit to the fineness of the metal mask. Further, because wraparound of evaporated material behind the metal mask occurs, there is a limit to the fineness of the pattern formed using a metal mask. In actuality, the limit is a resolution level of 150 pixels per inch (ppi), and formation of patterns at resolutions exceeding this is difficult. Further, as substrates grow larger there are greater demands on the rigidity of the metal mask, and when rigidity is insufficient, mask bending poses a problem. Because of this problem also, it is difficult to increase substrate sizes. In addition, reductions in yield occur due to pattern shifting when placing the metal mask on the substrate for film deposition and other problems, and so there is the further problem that cost reduction is difficult.

In order to address problems with evaporation deposition methods described above, technology has been proposed in which an inkjet method is used to form a color conversion layer (see Patent Document 4: Japanese Patent Application Laid-open No. 2004-253179, Patent Document 5: Japanese Patent Application Laid-open No 2006-73450, Patent Document 6: Japanese Patent Application Laid-open. No. 2006-32010, and Patent Document 7: Japanese Patent Application Laid-open No. 2003-229261).

On the other hand, a method has been proposed for superposing a plurality of types of color filter layers to form light blocking portions in desired regions, with the aim of suppressing increases in the number of manufacturing processes and increases in manufacturing costs in color filter-type displays not accompanied by color conversion layers (designs in which, by passing only specific wavelength regions of the light source light, light having the desired frequencies is emitted to the outside) (see Patent Document 8).

Patent Document 8: Japanese Patent Application Laid-open No. 2004-94236

However, proposals to form color conversion layers using inkjet methods all employ barrier walls that are formed separately. A barrier wall is deemed necessary in order to prevent the spreading from their desired positions of liquid drops, adhering to the film deposition substrate through use of the inkjet method. Separate formation of barrier walls entails an increase in the number of manufacturing processes, and a consequent increase in manufacturing costs.

Further, when forming a color conversion layer and color filter layer with high resolution, markers for positioning must be provided. However, the separate formation of markers also entails an increase in the number of manufacturing processes, and a consequent increase in manufacturing costs.

DISCLOSURE OF THE INVENTION

Hence, a first object of this invention is to provide a color conversion filter manufacturing method using an inkjet method, which enables formation of a color conversion layer at desired positions even when a barrier wall is not formed separately. A second object of this invention is to provide an organic EL display manufacturing method that applies the above-described color conversion filter manufacturing method.

The method for manufacturing a color conversion filter of a first embodiment of this invention is characterized in comprising (a) a step of forming a black matrix having a plurality of openings on a transparent substrate; (b) a step of independently forming at least two types of color filter layers, which transmit light in different wavelength regions, and superposing at least two color filter layers on the black matrix adjacent to the two different types of color filter layers, and thereby to form a barrier wall; and (c) a step of forming, by using an inkjet method, on at least one of she color filter layers, a color conversion layer which absorbs light of a specific wavelength, and outputs light comprising a wavelength different from the absorbed wavelength. Here, in step (b), the barrier wall may be formed by superposing two color filter layers. Or, in step (b), three types of color filter layer may be formed independently, and the barrier wall may be formed by superposing three color filter layers. In this case, the three types of color filter layers may each have a first portion, which is formed so as to cover an opening in the black matrix, and a second portion separated from the first portion and forming the barrier wall. This embodiment comprises color conversion filters manufactured by the above-described method and having at least one type of color conversion layer.

A first mode of the organic EL display manufacturing method of a second embodiment of the invention is characterized in comprising (1) a step of manufacturing a color conversion filter in use of the method according to the first embodiment; (2a) a step of forming a barrier layer on the color conversion filter; and (3a) a step of forming an organic EL element including, on the barrier layer, a transparent electrode, an organic EL layer, and a reflective electrode in this order. A second mode of the organic EL display manufacturing method of this embodiment is characterized in comprising (1) a step of manufacturing a color conversion filter in use of the method according to the first embodiment; (2b) a step of forming an organic EL element including, on a second support member, a reflecting electrode, an organic EL layer, and a transparent electrode in this order; (3b) a step of forming a barrier layer on the organic EL element; and (4) a step of combining the organic EL element formed with barrier layer with the color conversion filter, the color conversion layer with the barrier layer to be opposed respectively.

The color conversion filter of a third embodiment of the invention is characterized in comprising a transparent substrate; a black matrix having a plurality of openings on the transparent substrate; at least two types of color filter layers, which transmit light in different wavelength regions; and a color conversion layer, which is formed on at least one of the color filter layers, and formed surrounded by a barrier wall in which at least two adjacent color filter layers on the black matrix are superposed, and which absorbs light of a specific wavelength and outputs light comprising a wavelength different from the absorbed wavelength. Here, the barrier wall may be formed by superposing two color filter layers, or may be formed by superposing three types of independently formed color filter layers. When the barrier wall is formed by superposing three types of color filter layers, each of the three types of color filter layers may have a first portion, which is formed so as to cover openings in the black matrix, and a second portion, separated from the first portion, forming the barrier wall.

In this invention, by adopting a configuration described above, by layering a black matrix and at least two types of color filter layers in specific sites, the need to separately form barrier walls, which had been indispensable in inkjet methods proposed in the prior art, can be eliminated. Also, in a method of this invention, by being able to use a black matrix as a marker for positioning of an inkjet device in color filter layer patterning and color conversion layer formation, it is possible to form color conversion layers having high-resolution patterns with a resolution of 140 ppi or higher. Further, in a method of this invention, the film thickness of color filter layers as well as the black matrix film thickness can be used as the height of the barrier walls, so that barrier walls can be formed which more effectively prevent ink diffusion. And, a manufacturing method of this invention can avoid the above-described problems with evaporation deposition methods using metal masks. Further, by using this method it is possible to manufacture organic EL displays capable of high-resolution multicolor display.

BEST MODE FOR CARRYING OUT THE INVENTION

Figure 1A:
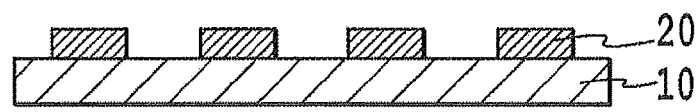
FIG. 1A is a cross-sectional view showing a layering process for a layer in the color conversion filter manufacturing method of a first mode of a first embodiment of the invention.

Below, preferred embodiments of the invention are explained in detail, referring to the drawings. The embodiments described below are merely examples of the invention, and various design modifications can be made as appropriate by a practitioner of the art.

A first embodiment of the invention is a method of manufacturing a color conversion filter, and comprises (a) a process of forming a black matrix, having a plurality of openings, on a transparent substrate; (b) a process of independently forming at least two types of color filter layers, which transmit light in different wavelength regions; and (c) a process of using an inkjet method to form, on at least one of die color filter layers, a color conversion layer which absorbs light of a specific wavelength, and outputs light comprising a wavelength different from the absorbed wavelength. In process (b), a characteristic is that barrier walls are formed by superposing at least two color filter layers on black matrix adjacent to different types of two color filter layers. In this invention, at least two types of color filter layers, which transmit light in different wavelength regions, are used, and more preferably three types of color filter layers are used.

First, a first mode of a method for manufacturing a color conversion filter of this embodiment is explained, for a case in which three types of color filter layers, which are red (R), green (G), and blue (B) are used, and with barrier walls formed by superposing two color filter layers 30R, 30G and 30B. FIG. 1A to FIG. 1E are cross-sectional views showing processes in the method of color conversion filter manufacture of this embodiment; FIG. 2A to FIG. 2C show the shapes of the respective color filter layers 30R, 30G and 30B, taking as an example a red color filter layer 30R formed first on the black matrix 20. FIG. 2A is a top view showing an example of the shapes of the color filter layers 30R, 30G and 30B; FIG. 2B and FIG. 2C are cross-sectional views along the section lines IIB-IIB and IIC-IIC respectively.

Figure 2A:
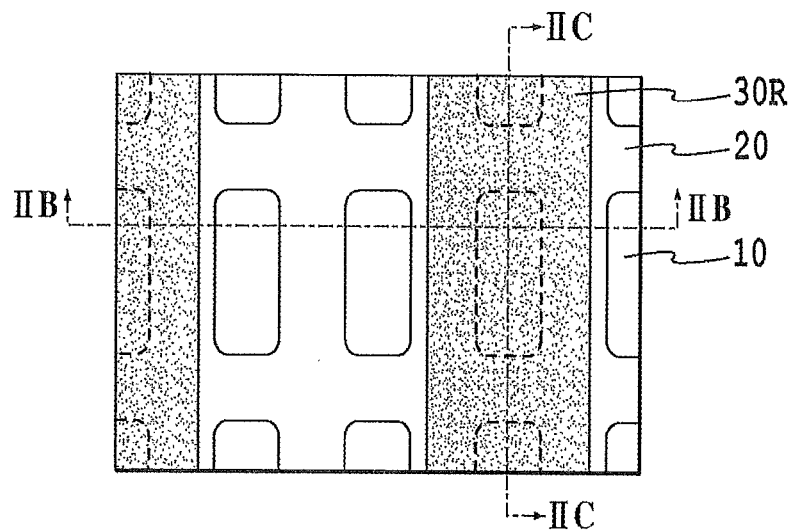
FIG. 2A is a top view showing an example of the color filter layer used in manufacture of the color conversion filter of the first mode of the first embodiment of the invention.
Figure 2B:
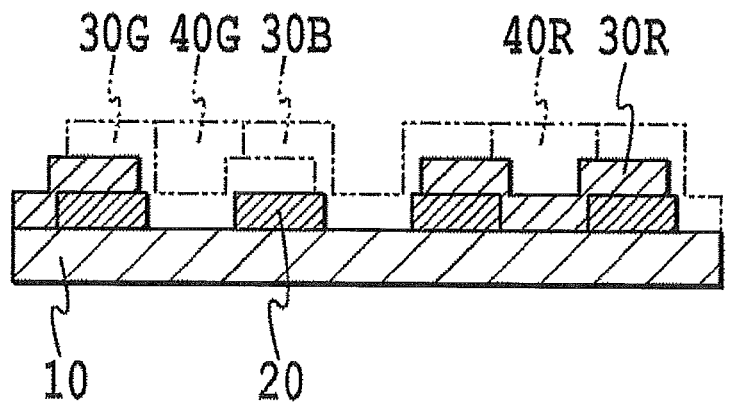
FIG. 2B is a cross-sectional view showing an example of the color filter layer used in manufacture of the color conversion filter of the first mode of the first embodiment of the invention, and is a cross-sectional view along section line IIB-IIB shown in FIG. 2A.
Figure 2C:
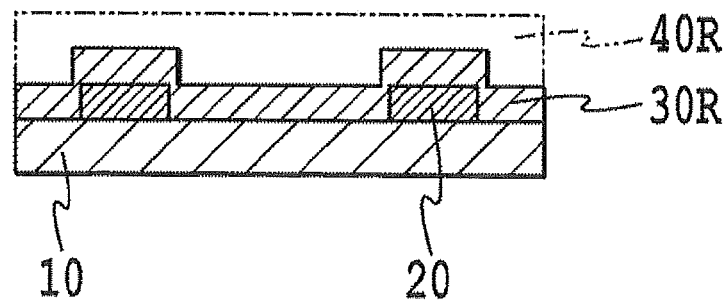
FIG. 2C is a cross-sectional view showing an example of the color filter layer used in manufacture of the color conversion filter of the first mode of the first embodiment of the invention, and is a cross-sectional view along section line IIC-IIC shown in FIG. 2A.

Initially, as shown in FIG. 1A, a black matrix 20 is formed on a transparent substrate 10. The black matrix 20 may be formed over the entire surface of the transparent substrate 10 using spin coating or another application method, and then patterned using photolithography or another method; or, a pattern may be formed using screen printing or another method. The black matrix 20 comprises stripe-shape portions extending in a first direction and in a second direction perpendicularly intersecting the first direction, formed as an integrated layer having a mesh shape having a plurality of openings. The openings of the black matrix 20 become the positions of formation of subpixels.

The transparent substrate 10 has high optical transmissivity, and is formed using material that can withstand the solvents, temperatures, and conditions used in forming the black matrix 20, the color filter layers 30R, 30G and 30B, the color conversion layers 40R and 40G, and the organic EL element, described below. It is further preferable that material with excellent dimensional stability be used. It is also preferable that the material, not cause reduced performance of the multicolor display. Examples of the material used in the transparent substrate. 10 include glass, various plastics, and various films.

The black matrix 20 is a layer which blocks visible light and improves contrast. The black matrix 20 can be formed using material used in ordinary flat panel displays. In particular, it is desirable that the material have resistance to solvents contained in ink used to form color conversion layers 40R and 40 G described below. The film thickness of the black matrix 20 can be set arbitrarily, so long as conditions on the height of the barrier walls, described below, are satisfied.

Next, at least two color filter layers 30R, 30G and 30B, which transmit light in different wavelength regions, are formed independently. The color filter layers 30R, 30G and 30B are layers provided to transmit visible light in specific wavelength regions, making the transmitted light the desired hue, and to improve the color purity of transmitted light. The color filter layers 30R, 30G and 30B can be formed using commercially available materials for flat panel displays. In recent years, pigment-dispersed materials, in which pigments are dispersed in a photoresist, have come into wider use. As shown in FIG. 1, when using three types of color filter layers, it is desirable that a blue color filter layer 30B transmitting light in the 400 nm to 550 nm wavelength region, a green color filter layer 30G transmitting light in the 500 nm to 600 cm wavelength region, and a red color filter layer 30R transmitting light in the wavelength region of 600 nm and above, be used.

Figure 1B:
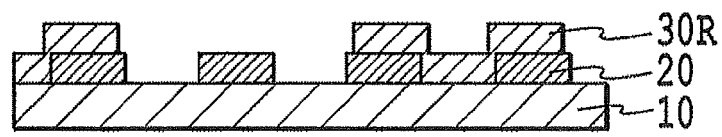
FIG. 1B is a cross-sectional view showing a layering process for a layer in the color conversion filter manufacturing method of the first mode of the first embodiment of the invention.

First, as shown in FIG. 1B, the red color filter layer 30R is formed. It is desirable that the red color filter layer 30R comprise a plurality of stripe-shaped portions extending in the first direction, as shown in FIG. 2A. At this time, the red color filter layer 30R is formed so as to overlap the black matrix 20 adjacent to openings for red subpixels in which the red color filter layer 30R is formed, that is, the black matrix 20 which is the boundary between different-color subpixels, as shown in FIG. 2B.

Figure 1C:
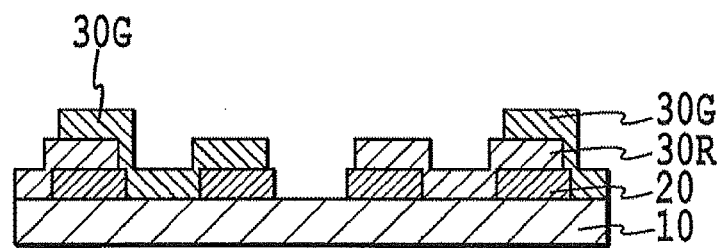
FIG. 1C is a cross-sectional view showing a layering process for a layer in the color conversion filter manufacturing method of the first mode of the first embodiment of the invention.

Second, as shown in FIG. 1C, the green color filter layer 30G is formed. It is desirable that the green color filter layer 30G also comprise a plurality of stripe-shape portions extending in the first direction, and, except for the fact that positions of formation are different, have shapes similar to those of the red color filter layer 30R shown in FIG. 2A and FIG. 2B. At this time, the green color filter layer 30G is formed so as to overlap with the layered member of the black matrix 20 and the red color filter layer 30R in sites between the green color filter layer 30G and the red color filter layer 30R, that is, between the red subpixels and the openings for green subpixels formed by the green color filter layer 30G.

Figure 1D:
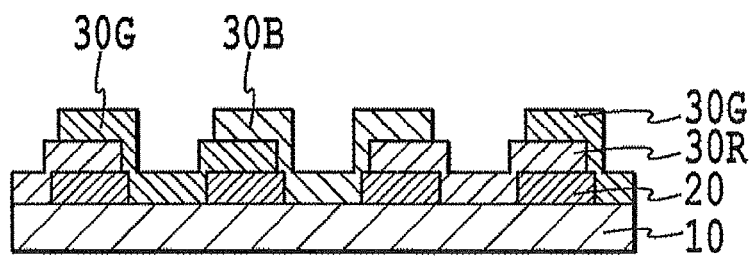
FIG. 1D is a cross-sectional view showing a layering process for a layer in the color conversion filter manufacturing method of the first mode of the first embodiment of the invention.

Third, as shown in FIG. 1D, the blue color filter layer 30B is formed. It is desirable that the blue color filter layer 30B comprise a plurality of stripe-shaped portions extending in the first direction, and, except for the fact that positions of formation are different, have shapes similar to those of the red color filter layer 30R shown in FIG. 2A and FIG. 2B. At this time, the blue color filter layer 30B is formed so as to overlap with the layered member of the adjacent black matrix 20 and red color filter layer 30R, and with the layered member of the adjacent black matrix 20 and the green color filter layer 30G. In other words, the blue color filter layer 30B is formed so as to overlap with the black matrix 20 and red color filter layer 30R in sites between the red subpixels and the openings for blue subpixels formed by the blue color filter layer 30B. Similarly, the blue color filter layer 30B is formed so as to overlap with the black matrix 20 and green color filter layer 30G in sites between the green subpixels and the openings for blue subpixels.

Each of the above-described color filter layers 30R, 30G and 30B may be patterned using photolithography or another method after being formed over the entire surface of the transparent substrate 10 using spin coating or another application method, or may be formed in a pattern using screen coating or another method. In the above explanation, the three types of color filter layers 30R, 30G and 30B are formed in the order of the red color filter layer 30R, green color filter layer 30G, and blue color filter layer 30B; but the order of formation may be modified as appropriate.

In the above processes, barrier walls are formed by layering two different types of color filter layers 30R, 30G and 30B on the black matrix 20 positioned between the two color filter layers. In this invention, "barrier wall height" is defined by the relation between a layered member on the black matrix 20 and the color filter layers 30R, 30G and 30B adjacent to the layered member and in contact with the transparent substrate 10. In this invention, "barrier wall height" means the difference between the total film thickness of the black matrix 20 and a layered member comprising two types of color filter layers among 30R, 30G and 30B, and the film thickness of the adjacent color filter layer among 30R, 30G and 30B. In this invention, it is desirable that the "barrier wall height" be from 2 to 4 μm.

In the above processes, a red back structure is obtained on the red subpixels, surrounded by two walls having a layered structure of the black matrix 20/red color filter layer 30R/green color filter layer 30G and a layered structure of the black matrix 20/red color filter 30R/blue color filter 30B, and having a stripe shape extending in the first direction. Similarly, a green back structure is obtained on the green subpixels, surrounded two walls having a layered structure of the black matrix 20/red color filter layer 30R/green color filter layer 30G and a layered structure of the black matrix 20/green color filter layer 30G/blue color filter layer 30B, and having a stripe shape extending in the first direction. A blue bank structure is similarly obtained on the blue subpixels.

Figure 1E:
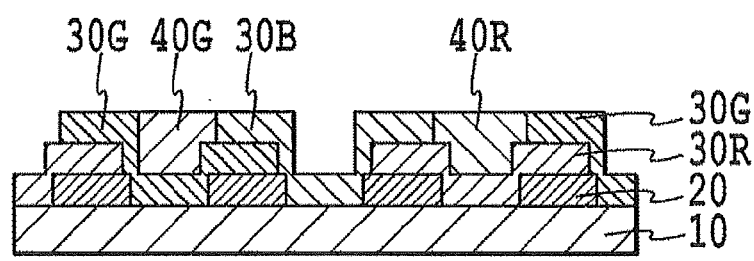
FIG. 1E is a cross-sectional view showing a layering process for a layer in the color conversion filter manufacturing method of the first mode of the first embodiment of the invention.

Next, as shown in FIG. 1E, an inklet method is used to form color conversion layers 40R and 40G on the color filter layers 30R, 30G and 30B in at least one type of bank structure. In this embodiment, at least one type of color conversion layer is formed. When using three RGB types of color filter layers, at least a red color conversion layer 40R is formed, and in addition a green color conversion layer 40G may also be formed. In FIG. 1E, a color conversion filter is shown in which a red color conversion layer 40R is formed in the red bank structure and a green color conversion layer 40G is formed in the green bank structure.

The ink used to form a color conversion layer 40 comprises at least one type of color conversion dye and a solvent. In this invention, it is desirable that a mixture of two types of color conversion dyes, comprising a first dye and a second dye, be used.

The first dye is a dye to absorb blue to blue-green light, incident on the color conversion layer 40 and preferably emitted by the organic EL element, and to transfer the absorbed energy to the second dye. Hence it is desirable that the absorption spectrum of the first dye overlap with the emission spectrum of the organic EL element, and it is still more desirable that the absorption maximum of the first dye coincide with the maximum in the emission spectrum of the organic EL element. Further, it is desirable that the emission spectrum of the first dye overlap with the absorption spectrum of the second dye, and it is still more desirable that the maximum in the emission spectrum of the first dye coincide with the absorption maximum of the second dye.

Dyes that are appropriate for use as the first dye in this invention include $Alq_3$ (tris(8-quinolinolato) aluminum complex) and other aluminum chelate dyes; 3-(2-benzothiazolyl)-7-diethylamino-coumarin (coumarin 6); 3-(2-benzoimidazolyl)-7-diethylamino-coumarin (coumarin 7); coumarin 135; and other coumarin dyes. Or, solvent yellow 43, solvent yellow 44, and other naphthalimide dyes, may be used as first dyes. In addition, various emissive materials with low molecular weights, and various emissive polymer materials can also be applied. It is desirable that the first dye exist in a quantity of from 50 to 99.99 molar percent, with reference to the total constituent molecular weight of the color conversion layer 40. By providing the first dye in this concentration range, light incident on the color conversion film can be adequately absorbed, and the absorbed optical energy can be transferred to the second dye.

Figure 9:
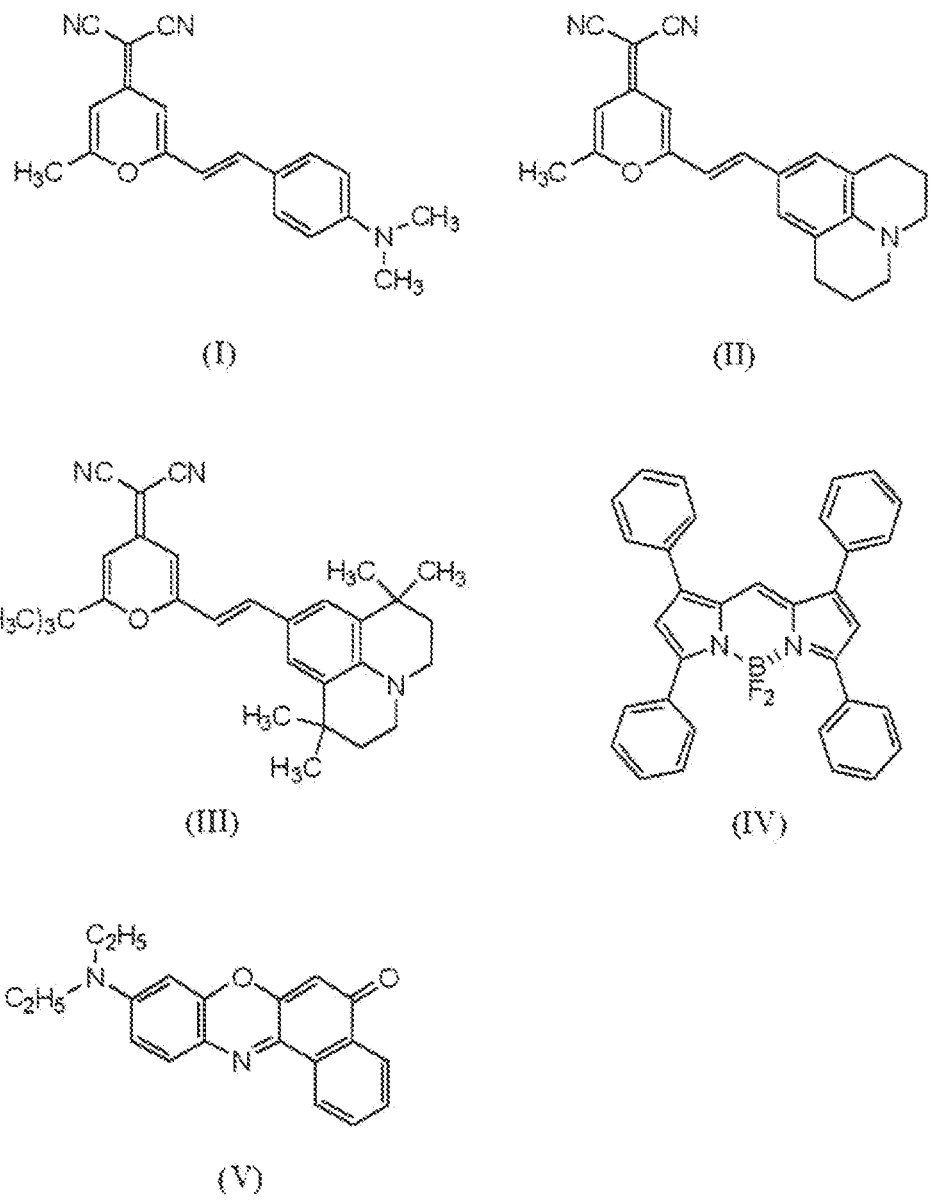
FIG. 9 illustrates exemplary dyes that can be appropriately used as dyes according to the invention.

The second dye is a dye that receives energy transferred from the first dye and emits light. As explained above, it is desirable that the emission spectrum of the first dye overlap with the absorption spectrum of the second dye, and it is still more desirable that the maximum in the emission spectrum of the first dye coincide with the absorption maximum of the second dye. Hence the light emitted by the second dye has a longer wavelength than the light absorbed by the first dye, and is green or red. In this invention, dyes which can be appropriately used as the second dye, such as those exemplary structures shown an FIG. 9, include diethyl quinacridone (DEQ) and other quinacridone derivatives; 4-dicyanomethylene-2-methyl-6-(p-dimethylaminostyryl)-4H-pyran(DCM-1, (I)), DCM-2 (III), and DCJTB (III) and other cyanine dyes; 4,4-difluoro-1,3,5,7-tetraphenyl-4-bora-3a,4a-diaza-s-indacene (IV), Lumogen F red, nile red (V), and similar. Or, rhodamine B, rhodamine 6G, or another xanthene dye, as well as pyridine 1 or another pyridine dye may be used. And, various emissive materials with low molecular weights, and various emissive polymer EL materials can also be applied.

In a color conversion layer 40R or 40G of this invention, the dye that emits light is the second dye, and so it is important that the second dye not cause concentration quenching. This is because concentration quenching by the second dye reduces the efficiency of color conversion. The upper limit, to the concentration of the second dye in a color conversion layer 40 of this invention may vary depending on the types of the first and second dyes, with the condition that concentration quenching not occur. The lower limit to the concentration of the second dye may vary depending on the types of the first and second dyes, or on the intended application, with the condition that adequate converted light intensity be obtained. In general, the preferred concentration of the second dye in color conversion layers 40R and 40G of this invention is 10 molar percent or less, with reference to the total constituent molecular weight of the color conversion layers 40R and 40G, more preferably is 0.01 to 10 molar percent, and still more preferably is 0.1 to 5 molar percent. By using a second dye at a concentration in such a range, concentration quenching can be prevented, and at the same time adequate converted light intensity can be obtained.

As explained above, by adopting a configuration which employs different types of dyes to realize absorption and color conversion of incident light, the difference between the peak wavelength for absorption of incident light by the first dye and the wavelength of color-converted light emitted by the second dye can be made large. Further, by separating functions, there is expanded freedom in choosing materials for use as the first dye and the second dye.

Or, if blue to blue-green light can be absorbed and color-converted light of adequate intensity can be obtained without concentration quenching by the first dye alone, then a second dye need not be used.

The solvent for ink used to form a color conversion layer of this invention can be a solvent chosen arbitrarily which is able to dissolve the above dyes. For example, toluene or another benzene-based nonpolar solvent, chloroform, an alcohol, a ketone, or another polar solvent, can be used as an ink solvent. The ink solvent need not comprise a single component, and may be a mixture of a plurality of solvents.

In this embodiment, ink can be manufactured by mixing at least one type of color conversion dye in a solvent. In order to eliminate the effects of water and oxygen, it is preferable that the ink be manufactured in an inert gas atmosphere, such as a nitrogen or argon atmosphere. Prior to manufacturing the ink, degasification treatment, treatment with a water absorbent, treatment with an oxygen absorbent, distillation, or other arbitrary means known in the field may be used to perform preliminary treatment of the solvent in order to remove water and oxygen from the solvent.

The manufactured ink is caused to adhere onto the color filter layers 30R, 30G and 30B within the bank structure using an arbitrary inkjet device and method known in the field, with the condition that application at the desired resolution be possible. The inkjet device and method may employ a thermal inkjet method, or may employ a piezoelectric inkjet method. The ink which is caused to adhere using an inkjet method is prevented from spreading outside the required sites by the barrier walls comprising the layered members of two types of color filter layers on the black matrix, and so the color conversion layers 40R and 40G can be formed at prescribed positions. In this embodiment, in addition to the total film thickness of two overlapping types of color filter layers 30R, 30G and 30B, the film thickness of the black matrix 20 also contributes to the height of the barrier walls, so that diffusion of the ink, caused to adhere by the inkjet method outside the required sites can be more effectively prevented.

After adhesion, the solvent is eliminated by evaporation, and a color conversion layer 40R comprising at least one type of color conversion dye is formed. Solvent elimination can be performed in the above-described inert gas atmosphere or in vacuum by heating to a temperature at which the solvent evaporates. At this time it is desirable that the heating temperature be set such that degradation or thermal decomposition of color conversion dyes in the ink does not occur.

A color conversion layer 40R in this invention has a film thickness of 2000 nm (2 µm) or less, preferably a film thickness of 100 to 2000 nm, and still more preferably a film thickness of 100 to 1000 nm. When an arbitrarily selected thermosetting resin composition is comprised, it is preferable that a color conversion layer 40R of this invention have a film thickness of 100 to 200 nm. In a color conversion layer 40 of this invention, the first dye, which forms a major portion thereof, functions to absorb incident right, and so light absorptance is adequate even at such a thin film thickness. While the invention is not constrained by any theoretical considerations, it is thought that when the first dye in a color conversion layer 40R of this invention absorbs light and is in an excited state, energy transfer from the first dye to the second dye occurs more readily than energy transfer among the first dye. Hence it is thought that a large portion of the excitation energy of the first dye is transferred to the second dye without being lost through transfer among the first dye (concentration quenching), and so can contribute to light emission by the second dye. And, as explained above, the second dye exists at a low concentration at which concentration quenching does not readily occur, so that transferred excitation energy can be efficiently utilized to perform color conversion, and light having the desired wavelength distribution can be emitted. In this way, both a thin film thickness and efficient color conversion can be achieved in a color conversion layer 40 of this invention.

A color conversion layer 40R obtained through the above processes has a stripe shape extending in the first direction, similarly to the color filter layers 30R, 30G and 30B. Taking a red color conversion layer 40R as an example, as shown in FIG. 2C, although there exist steps above the black matrix 20 positioned between two red subpixel openings in which the red color filter layer 30R is provided due to superposing of the red color filter layer 30R, the step height is equivalent to the film thickness of the black matrix 20, and does not prevent diffusion of ink used to form the red conversion layer 40R, and so the red conversion layer 40R is formed in a stripe shape which is connected in the first direction across a plurality of subpixels.

Figure 3A:
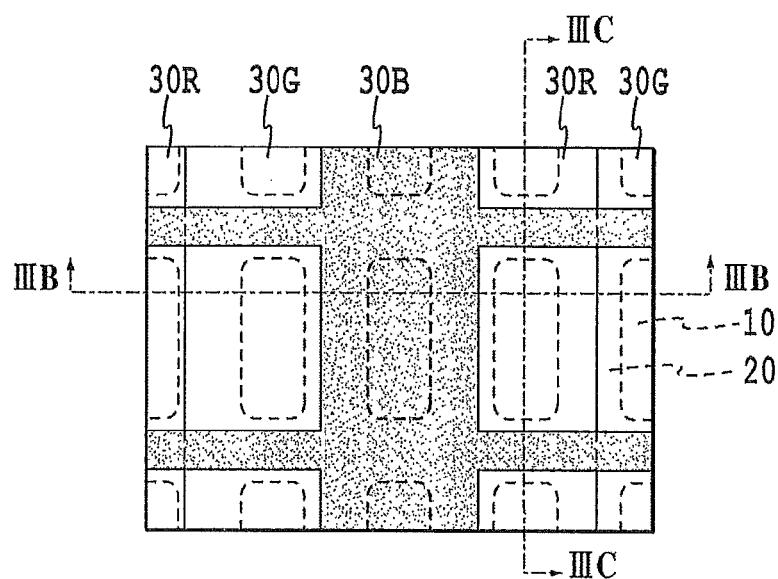
FIG. 3A is a top view showing an example of the color filter layer last formed in a modified example of the color conversion filter manufacturing of the first mode of the first embodiment of the invention.
Figure 3B:
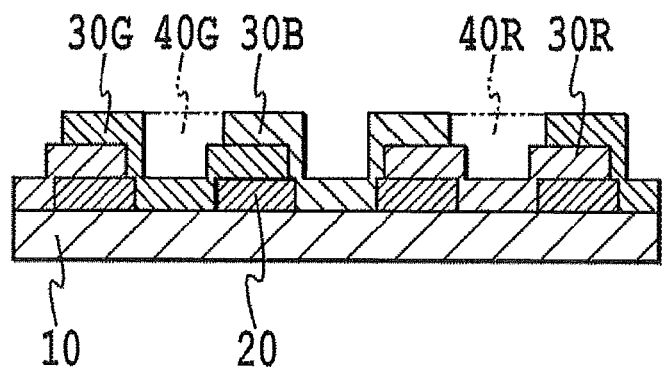
FIG. 3B is a cross-sectional view showing an example of the color filter layer last formed in the modified example of the color conversion filter manufacturing of the first mode of the first embodiment of the invention, and is a cross-sectional view along section line IIIB-IIIB shown in FIG. 3A.
Figure 3C:
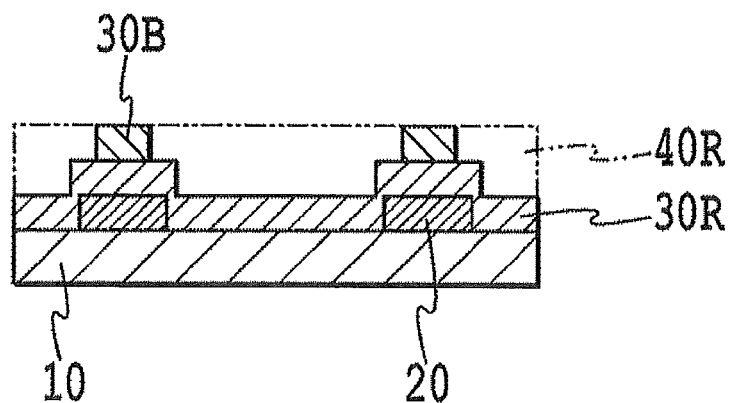
FIG. 3C is a cross-sectional view showing an example of the color filter layer last formed in the modified example of the color conversion filter manufacturing of the first mode of the first embodiment of the invention, and is a cross-sectional view along section line IIIC-IIIC shown in FIG. 3A.

As a modified example of the above first mode, barrier walls may be formed by superposing the last-formed color filter layer 30B on the black matrix 20 positioned between two openings in which the same type of color filter layer 30B is provided, as shown in FIG. 3. In FIG. 3, an example is shown in which the shape of the blue color filter layer 30B is modified. FIG. 3A shows the top-view shape of the blue color filter layer 30B, FIG. 3B is a cross-sectional view along the section line IIIB-IIIB, and FIG. 3C is a cross-sectional view along the section line IIIC-IIIC. As shown in FIG. 3A, the blue color filter layer 30B covers a plurality of blue subpixel openings, and comprises stripe-shape portions extending in the first direction above the adjacent black matrix 20 and superposed on different-type color filter layers 30R, 30G and 30B (the red color filter layer 30R or the green color filter layer 30G), and portions over the black matrix 20 extending in the second direction perpendicularly intersecting the first direction. As shown in FIG. 3B, in this modified example, barrier walls extending in the first direction are formed at the boundaries between red subpixels and green subpixels or blue subpixels, by layering two types of color filter layers 30R, 30G and 30B on the black matrix 20 similarly to the above-described mode, and, as shown in FIG. 3C, barrier walls extending in die second direction are formed by superposing the black matrix 20, the red color filter layer 30R and the blue color filter layer 30B. Hence in this modified example, barrier walls are formed surrounding each of the red subpixels, and independent bank structures are obtained for each subpixel. A similar structure is obtained for green subpixels also. The independent bank structures for each subpixel are effective for suppressing variation in the film thickness of the color conversion layer 40R among subpixels.

Next, a second mode of a color conversion filter manufacturing method of this embodiment is explained, in which barrier walls are formed by superposing three color filter layers 30R, 30G and 30B, for a case in which three types of color filter layers for red (R), green (G), and blue (B) are used. When superposing the color filter layers and black matrix to form barrier walls, increasing the film thickness of the black matrix is effective for raising the barrier wall height. However, when forming the black matrix from a negative type material, exposed portions remain as the pattern, and moreover the irradiated light is absorbed by the black matrix material, so that if the film thickness is approximately 2 μm or greater, formation of the black matrix is difficult. And, when raising the barrier wall height, there are cases in which the film thickness of the color filter layers at the apex of protrusions (barrier wall formation sites) is less than the film thickness of color filter layers existing in black matrix openings, depending on the viscosity of the superposed color filter layer materials, the base wettability, application conditions, and other factors. This mode is effective for avoiding the effects of such problems.

In the second mode also, except for the top-view shape of the color filter layers 30R, 30G and 30B formed, the processes explained in the first mode can be used to manufacture a color conversion filter. In this mode, in addition to the total of the film thicknesses of the three superposed color filter layers 30R, 30G and 30B, the film thickness of the black matrix 20 also contributes to the height of the barrier wall. Also, in this mode, by superposing three color filter layers 30R, 30G and 30B to form barrier walls, barrier walls can be formed which are higher than in the first mode. And, even when thinner color filter layers are used, barrier walls with sufficient height can be obtained.

Figure 4A:
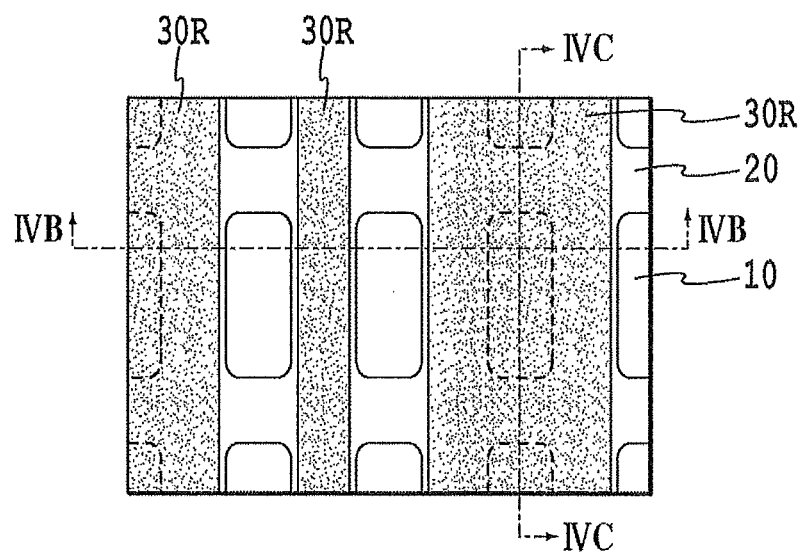
FIG. 4A is a top view showing an example of the color filter layer used in color conversion filter manufacturing in a second mode of the first embodiment of the invention.
Figure 4B:
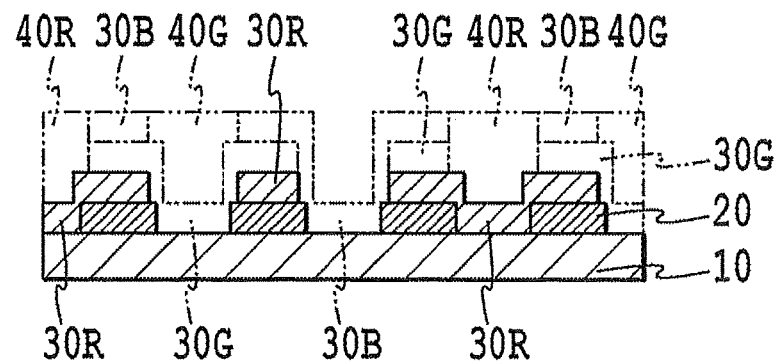
FIG. 4B is a cross-sectional view showing an example of the color filter layer used in color conversion filter manufacturing in the second mode of the first embodiment of the invention, and is a cross-sectional view along section line IVB-IVB shown in FIG. 4A.
Figure 4C:
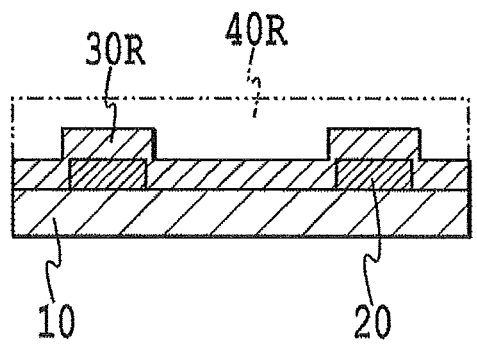
FIG. 4C is a cross-sectional view showing an example of the color filter layer used in color conversion filter manufacturing in the second mode of the first embodiment of the invention, and is a cross-sectional view along section line IVC-IVC shown in FIG. 4A.

A first example of the second mode is explained referring to FIG. 4. In FIG. 4, a red color filter layer 30R initially formed on the black matrix 20 is shown as an example of a color filter layer 30R, 30G and 30B. The green color filter layer 30G and blue color filter layer 30B also have shapes similar to that of the red color filter layer 30R, except or the position of formation. FIG. 4A shows the top-view shape of the red color filter layer 30R, FIG. 4B is a cross-sectional view along section line. IVB-IVB, and FIG. 4C is a cross-sectional view along section line IVC-IVC. In FIG. 4B and FIG. 4C, the layers formed thereafter are also shown.

In this example, as shown in FIG. 4A, each of the color filter layers 30R, 30G and 30B comprises two types of separate stripe-shape portions. The first stripe-shape portions are formed in the openings of the black matrix 20 which become the subpixels for that color and on the black matrix 20 at the boundaries between different types of color filter layers 30R, 30G and 30B, that is, at the boundaries between subpixels of different colors. The second stripe-shape portions are formed on the black matrix 20 at boundaries between different-color subpixels not adjacent to the subpixels of that color. By layering color filter layers 30R, 30G and 30B comprising two such separate portions, harrier walls are formed by successive layering of three types of color filter layers 30R, 30G and 30B on portions of the black matrix 20 extending in the first direction which are boundaries between different types of color filter layers 30R, 30G and 30B, as shown in FIG. 4B. In this example, although, with the color filter layers 30R, 30G and 30B being superimposed, there exist steps on the black matrix 20 at positions between two openings in which the same type of color filter layer 30R, 30G and 30B is provided, that is, between two subpixels of the same color, as shown in FIG. 4C, the step height is equivalent to the film thickness of the black matrix 20, and does not prevent diffusion of ink to form color conversion layers 40. That is, in this example a bank structure is obtained for each color having a stripe shape extending in the first direction, as shown in FIG. 1 and FIG. 2.

Within these bank structures are formed stripe-shape color conversion layers 40 connected in the first direction.

Figure 5A:
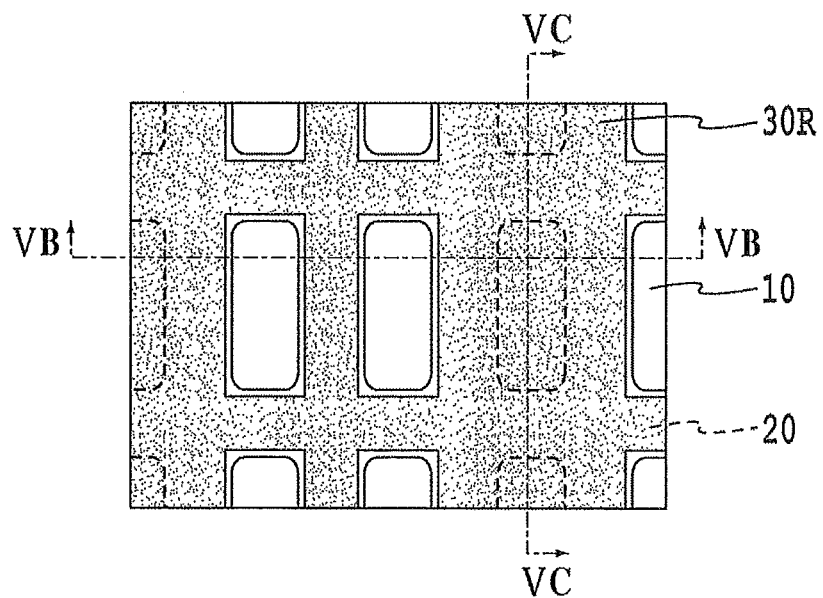
FIG. 5A is a top view showing another example of the color filter layer used in color conversion filter manufacturing in the second mode of the first embodiment of the invention.
Figure 5B:
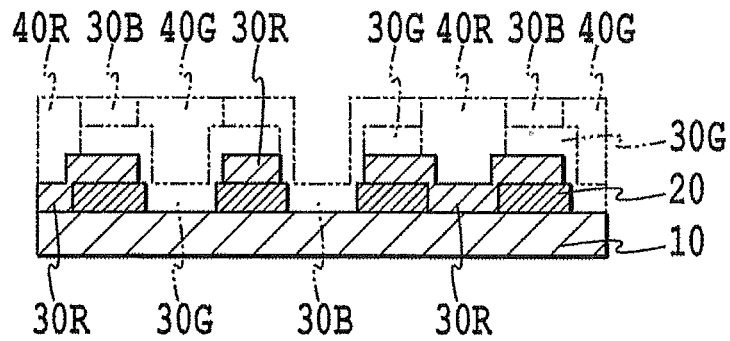
FIG. 5B is a cross-sectional view showing another example of the color filter layer used in color conversion filter manufacturing in the second mode of the first embodiment of the invention, and is a cross-sectional view along section line VB-VB shown in FIG. 5A.
Figure 5C:
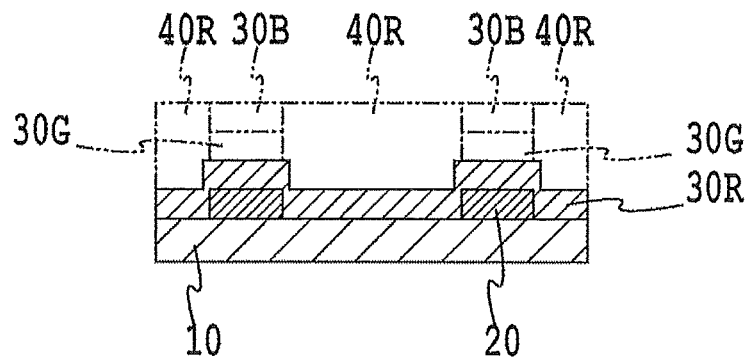
FIG. 5C is a cross-sectional view showing another example of the color filter layer used in color conversion filter manufacturing in the second mode of the first embodiment of the invention, and is a cross-sectional view along section line VC-VC shown in FIG. 5A.

A second example of the second mode is explained referring to FIG. 5. In FIG. 5, a red color filter layer 30R initially formed on the black matrix 20 is shown as an example of a color filter layer 30R, 30G and 30B. The green color filter layer 30G and blue color filter layer 30B also have shapes similar to that of the red color filter layer 30R, except for the position of formation. FIG. 5A shows the top-view shape of the red color filter layer 30R, FIG. 5B is a cross-sectional view along section line VB-VB, and FIG. 5C is a cross-sectional view along section line VC-VC. In FIG. 5B and FIG. 5C, the layers formed thereafter are also shown.

In this example, each of the color filter layers has an integrated structure in which the two types of separate stripe-shape portions shown in FIG. 4A are formed on the black matrix 20 at positions between two openings in which the same type of color filter layer 30R, 30G and 30B is provided (subpixels of the same color), connected by stripe-shape portions extending in the second direction (see FIG. 5A). In this example also, as shown in FIG. 5B, barrier walls are formed in which the three types of color filter layers 30R, 30G and 30B are layered in sequence in portions of the black matrix 20 extending in the first direction which are boundaries between different-color subpixels. In addition, as shown in FIG. 5C, barrier walls are formed with the three types of color filter layers 30R, 30G, 30B layered on the black matrix 20 at positions between two subpixels of the same color as well. Thus in this example, barrier walls are formed so as to surround each of the subpixels for all of the subpixels of the three colors (R, G, B), and independent bank structures are obtained for each subpixel. The independent bank structures formed in this way for each subpixel are effective for suppressing variation in the film thickness of color conversion layers 40 among subpixels.

Figure 6A:
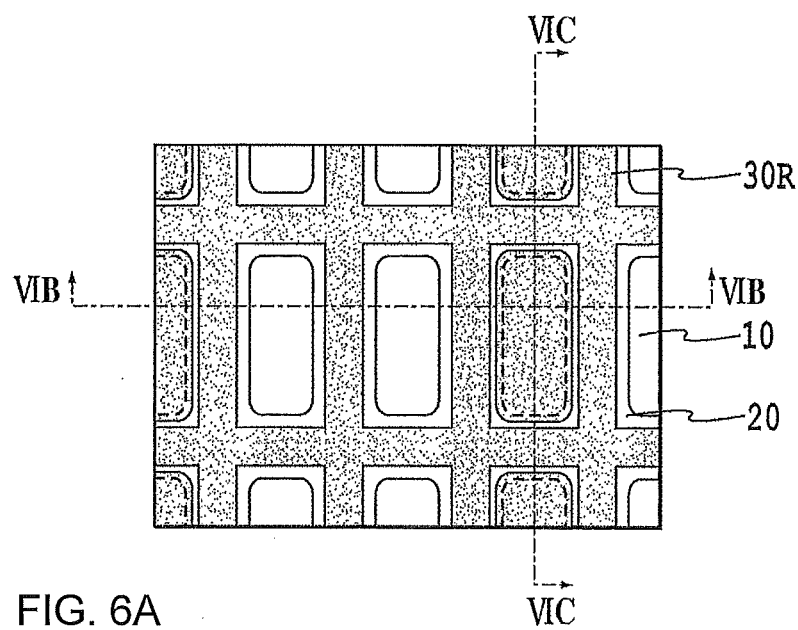
FIG. 6A is a top view showing another example of the color filter layer used in color conversion filter manufacturing in the second mode of the first embodiment of the invention.
Figure 6B:
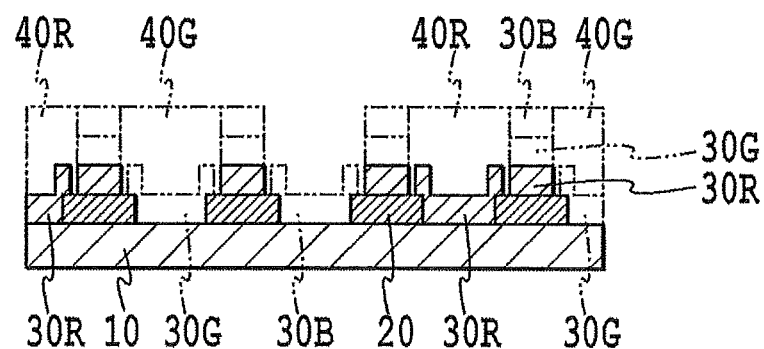
FIG. 6B is a cross-sectional view showing another example of the color filter layer used in color conversion filter manufacturing in the second mode of the first embodiment of the invention, and is a cross-sectional view along section line VIB-VIB shown in FIG. 6A.
Figure 6C:
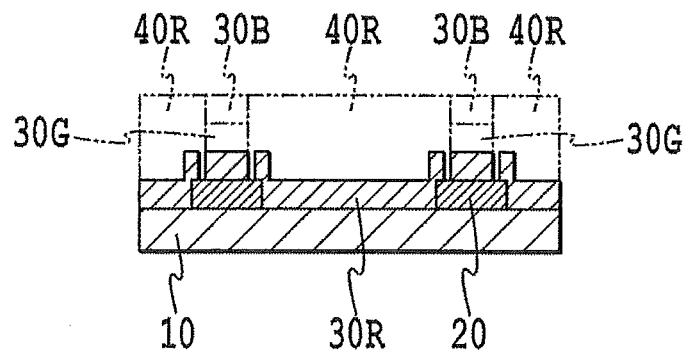
FIG. 6C is a cross-sectional view showing another example of the color filter layer used in color conversion filter manufacturing in the second mode of the first embodiment of the invention, and is a cross-sectional view along section line VIC-VIC shown in FIG. 6A.

A third example of the second mode is explained referring to FIG. 6. In FIG. 6, a red color filter layer 30R initially formed on the black matrix 20 is shown as an example of a color filter layer 30R, 30G and 30B. The green color filter layer 30G and blue color filter layer 30B also have shapes similar to that of the red color filter layer 30R, except for the position of formation. FIG. 6A shows the top-view shape of the red color filter layer 30R, FIG. 6B is a cross-sectional view along section line VIB-VIB, and FIG. 6C is a cross-sectional view along section line VIC-VIC. In FIG. 6B and FIG. 6C, the layers formed thereafter are also shown.

In this example, as shown in FIG. 6A, each, of the color filter layers 30R, 30G and 30B comprises two types of separate portions. The first rectangular portions are subpixel portions formed go as to cover the openings of the black matrix 20 which become subpixels for that color. The second mesh-shape portions are formed on the black matrix 20, and are formed with a combination of stripe-shape portions extending in two perpendicular directions so as to surround openings that are to become subpixels. As shown in FIG. 4B and FIG. 4C, barrier walls are formed on the black matrix 20 by layering in sequence the mesh-shape portions of three types of color filter layers 30R, 30G and 30B in this example, similarly to the example shown in FIG. 5, barrier walls are formed so as to surround each of the subpixels for all of the subpixels of the three colors (R, G, B), and independent bank structure are obtained for each subpixel. This configuration is effective when the width of the black matrix 20 is sufficiently large compared with the width when fabricating color filter layers 30R, 30G and 30B; by separating the subpixel portions and the mesh-shape portions used to form barrier walls, instability in the film thickness near regions where color filter layers 30R, 30G and 30B are superposed (barrier wall formation regions) can be suppressed, barrier wall shapes can be made uniform, and the capacities of bank structures formed by the barrier walls can be made uniform.

A second embodiment of the invention is an organic EL display manufacturing method comprising a process of manufacturing a color conversion filter, and a process of forming an organic EL element comprising a transparent electrode, organic EL layer, and reflective electrode.

Figure 7:
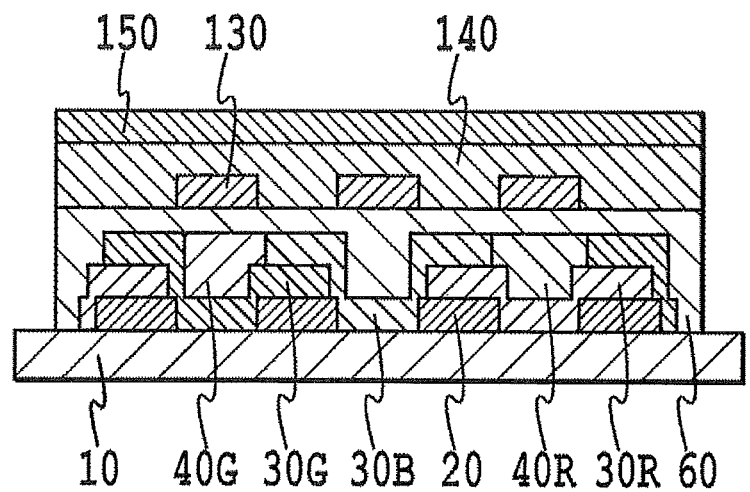
FIG. 7 is a cross-sectional view showing the organic EL display (one pixel's worth) of a first mode of a second embodiment of the invention.

A first mode of the organic EL display manufacturing method of this embodiment comprises: (1) a process of manufacturing a color conversion filter using a method of the first embodiment; (2) a process of forming a barrier layer on the color conversion filter; and (3) a process of forming, on the barrier layer, an organic EL element comprising a transparent electrode, an organic EL layer, and a reflective electrode, in this sequence. FIG. 7 shows an organic EL display obtained in this mode.

In this mode, as an arbitrarily selected option, a flattening layer (not shown) may be formed prior to forming the barrier layer on the color conversion filter. A flattening layer is effective for alleviating steps formed by the color filter layers 30R, 30G and 30B and color conversion layers 40, and for preventing disconnection of transparent electrodes and/or reflective electrodes in the organic EL elements formed thereafter. When the above-described steps have no effect on formation of organic EL elements, a flattening layer may be omitted.

The material used to form the flattening layer must have ample transparency and must enable formation without causing degradation of color filter layers 30R, 30G and 30B or color conversion layers 40, and moreover must withstand the conditions of formation of the barrier layer 60, described below.

For example, by applying a photohardening or photo-thermohardening resin, then performing light and/or heat treatment, generating radicals and ions and causing polymerization or bridging to perform curing, a flattening layer can be formed. Photohardening or photo-thermohardening resins which can be used include (1) a composition comprising acrylic polyfunctional monomers and oligomers having a plurality of acroyl groups or methacroyl groups, and a photo or thermo-polymerization initiator; (2) a composition comprising a polyvinyl ester cinnamate and a sensitizer; (3) a composition comprising a chain or ring olefin and bisazido; and (4) a composition comprising a monomer having an epoxy group and a photoacid generator. In particular, the composition of (1) is preferable due to the ability to perform high-resolution patterning and the high reliability of solvent resistance, heat resistance, and other properties. When performing partial light and/or heat treatment to perform patterning of the flattening layer, it is preferable that a resin that in the unhardened state is soluble in an organic solvent or an alkaline solvent be used.

Or, a flattening layer may be formed using polycarbonate (PC), polyethylene terephthalate (PET), polyethersulfone, polyvinyl butyral, polyphenylene ether, polyamide, polyether imide, norbornene system resin, methacrylic resin, isobutylene anhydric maleic copolymer resin, a ring olefin system or other thermoplastic resin; an epoxy resin, phenol resin, urethane resin, acrylic resin, vinyl ester resin, imide system resin, urethane system resin, urea resin, melamine resin, or other thermohardening resin; or a polystyrene, polyacrylonitrile, polycarbonate, or other polymer hybrid comprising trifunctional or tetrafunctional alkoxysilane, or similar. In this case, after applying a solution or fluid dispersion of these materials, the solvent or dispersion medium can be eliminated, and where necessary hardening treatment performed, to obtain a flattening layer.

When a solvent or dispersion medium is used in forming the flattening layer, it is desirable that the solvent or dispersion medium be selected such that elution of the underlying color conversion layers 40 does not occur. Or, a protective layer may be formed prior to formation of the flattening layer to prevent elution of the color conversion layers 40. A protective layer can for example be formed using a material and method similar to those used for the barrier layer 60 described below.

Next, a barrier layer 60 is formed so as to cover the above-described black matrix 20, color filter layers 30R, 30G and 30B, color conversion layers 40, and flattening layer (when a flattening layer exists). The barrier layer 60 may be a single layer, or may be a layered member of a plurality of layers. The barrier layer 60 is effective for protecting the constituent elements of the organic EL layer 140 described below from water and oxygen which may be contained in layers formed therebelow.

The barrier layer 60 can be formed using a material having barrier properties with respect to gases and organic solvents, and which has ample transparency in the visible range (transmittance of 50% or higher in the range from 400 to 700 nm). In order to withstand fabrication of the transparent electrode 130 described, below, it is desirable that the barrier layer 60 be formed using a material having a film hardness of, preferably, 2H or higher. Materials that can be used include for example $SiO_x$, $AlO_x$, $TiO_x$, $TaO_x$, $ZnO_x$, and other inorganic oxides, $SiN_x$ and other inorganic nitrides, and $SiN_xO_y$ and other inorganic oxynitrides. The barrier layer 60 can be formed using an arbitrary method which is well known in the field, such as sputtering, CVD, vacuum deposition, and similar. It is desirable that the barrier layer 60 be formed from $SiN_x$ with a high refractive index using a CVD method with satisfactory coverage.

Finally, the organic EL element is provided on the upper face of the barrier layer 60. In this mode, the organic EL element comprises, in sequence, a transparent electrode 130, organic EL layer 140, and reflective electrode 150. The organic EL element of this mode has a plurality of light emission portions, which can be independently controlled so as to emit or not emit light.

As a first stage, the transparent electrode 130 is provided on the upper face of the barrier layer 60. The transparent electrode 130 can be formed using ITO, tin oxide, indium ozide, IZO, zinc oxide, zinc-aluminum oxide, zinc-gallium oxide, or a conductive transparent metal oxide of any of these with F, Sb, or similar added as a dopant. The transparent electrode 130 is formed by depositing the above-described conductive transparent metal oxide over the entire face using evaporation deposition, sputtering, or a chemical vapor deposition (CVD) method, and then performing patterning using photolithography or similar. It is preferable that sputtering be used. The transparent electrode 130 comprises a plurality of stripe-shape partial electrodes extending in the first direction. The plurality of partial electrodes are provided in positions corresponding to the color filter layers 30R, 30G and 30B.

The transparent electrode 130 may be an anode or a cathode. When the transparent electrode 130 is used as a cathode, a cathode buffer layer may be provided between the transparent electrode 130 and the organic EL layer 140, to improve the electron injection efficiency. A cathode buffer layer can be formed from Li, Na, K, Cs, or another alkali metal, Ba, Sr, or another alkali earth metal or rare earth metal, an alloy comprising such metals, a fluoride of such metals, or similar. From the standpoint of ensuring transparency, it is desirable than she film thickness of the cathode buffer layer be 10 nm or less.

As a second stage, an organic EL layer 140 is provided on the upper face of the transparent electrode 130. In this invention, the organic EL layer 140 comprises at least an organic light-emission layer, and as necessary may have a structure in which a hole injection layer, hole transport layer, electron transport layer, and/or electron injection layer are interposed. Specifically, layer structures such as the following may be adopted in the organic EL element.

(1) Anode/organic light-emitting layer/cathode
(2) Anode/hole injection layer/organic light-emitting layer/cathode
(3) Anode/organic light-emitting layer/electron injection layer/cathode
(4) Anode/hole injection layer/organic light-emitting layer/electron injection layer/cathode
(5) Anode/hole transport layer/organic light-emitting layer/electron injection layer/cathode.
(6) Anode/hole injection layer/hole transport layer/organic light-emitting layer/electron injection layer/cathode
(7) Anode/hole injection layer/hole transport layer/organic light-emitting layer/electron transport layer/electron injection layer/cathode Each of the layers comprised by the organic EL layer 140 is formed using arbitrary materials known in the field. For example, as materials for an organic light-emitting layer to obtain blue to blue-green emitted light, benzothiazole system, benzoimidazole system, benzoxazole system, and other fluorescent brighteners, metal chelate oxonium compounds, styrylbenzene system compounds, aromatic dimethylydene system compounds, and other materials can for example be appropriately used. Further, where necessary the emission color of the organic light-emitting layer may be white. In this case, a well-known red dopant is used. Also, each of the layers comprised by the organic EL layer 140 can be formed using an arbitrary method that is well known in the field, such as evaporation deposition.

As a third stage, a reflective electrode 150 is provided on the upper face of the organic EL layer 140. It is preferable that the reflective electrode 150 be formed using a metal, amorphous alloy, or micro-polycrystalline alloy with high reflectivity. Metals with high reflectivity include Al, Ag, Mo, W, Ni, Cr, and similar. Amorphous alloys with high reflectivity include. NiP, NiB, CrP, CrB, and similar. Micro-polycrystalline alloys with high reflectivity include NiAl and similar. The reflective electrode 150 may be used as the cathode, or may be used as the anode. When using the reflective electrode 150 as the cathode, the above-described cathode buffer layer may be provided at the interface between the reflective electrode 150 and the organic EL layer 140 to improve the efficiency of electron injection into the organic EL layer. Or, lithium, sodium, potassium, or another alkali metal, or calcium, magnesium, strontium, or another alkali earth metal with low work function can be added to the above-described high-reflectivity metal, amorphous alloy or micro-polycrystalline alloy to induce alloying and improve the electron injection efficiency. On the other hand, when using the reflective electrode 150 as an anode, the above-described conductive transparent metal oxide layer may be provided at the interface between the reflective electrode 150 and the organic EL layer 140 to improve the efficiency of hole injection into the organic EL layer 140. Depending on the material used, the reflective electrode 150 can be formed using any arbitrary means known in the field, such as evaporation deposition, sputtering, ion plating, laser ablation, and similar.

The reflective electrode 150 comprises a plurality of stripe-shape partial electrodes extending in the second direction perpendicular to the first direction. The reflective electrode 150, comprising the plurality of partial electrodes can be formed by evaporation deposition using a mask having openings that provide desired shapes. Or, after forming the transparent electrode 130, stripe-shape separation partitions may be formed having a reverse-taper cross-sectional shape and extending in the second direction, and thereafter the organic EL layer 140 and reflecting electrode 150 may be formed, to form a reflective electrode 150 comprising a plurality of partial electrodes.

By means of the above method, a bottom-emission type organic EL display with passive-matrix driving can be obtained.

Figure 8:
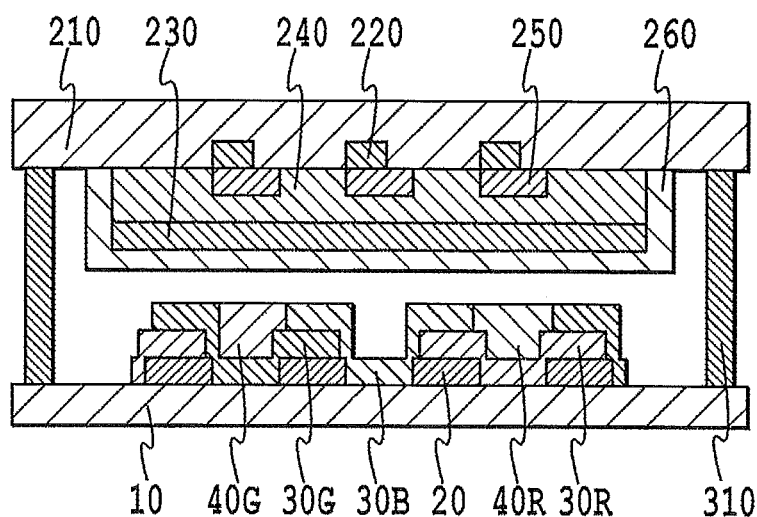
FIG. 8 is a cross-sectional view showing the organic EL display (one pixel's worth) of a second mode of the second embodiment of the invention.

A second mode of the organic EL display manufacturing method of this embodiment comprises: (1) a process of manufacturing a color conversion filter using a method of the first embodiment; (2) a process of forming, on a second support member, an organic EL element comprising, in sequence, a reflective electrode, an organic EL layer, and a transparent electrode; (3) a process of forming a barrier layer on the organic EL element; and (4) a process of combining the organic EL element on which is formed the barrier layer and the color conversion filter, such that the color conversion layer and the barrier layer are opposed. An organic EL display obtained in this mode is shown in FIG. 8.

In process (2), an organic EL element is formed comprising, in sequence on the second support member 210, a reflective electrode 250, an organic EL layer 240, and a transparent electrode. 230. The second support member may be transparent or opaque, and can be formed using glass, silicon, ceramics, various plastics, various films, and similar. A plurality of switching elements 220 may be provided on the surface of the second support member 210 at positions corresponding to the light-emitting portions of the organic EL element. The plurality of switching elements 220 may be for example TFTs, MIMs, or other arbitrary elements known in the field. In this case, wiring, driving circuits, and the like for the plurality of switching elements 220 may also be provided on the surface of the second support member 210.

The reflective electrode 250 is formed using material similar to that of the reflective electrode 150 of the first mode, using evaporation deposition, sputtering, ion plating, laser ablation, or other arbitrary means known in the field. The reflective electrode 250 comprises a plurality of partial electrodes corresponding to the plurality of switching elements 220. Division into the plurality of partial electrodes may be performed using an arbitrary method known in the field, such as a photolithography method.

The organic EL layer 240 is formed on the reflective electrode 250. The organic EL layer 240 can be formed using a material and method similar to those of the organic EL layer 140 of the first mode.

The transparent electrode 230 is formed on the organic EL layer 240. The transparent electrode 230 is formed using material similar to that of the transparent electrode 130 of the first mode. The transparent electrode 230 can be formed using evaporation deposition, sputtering, or CVD. The transparent electrode 230 is a monolithic common electrode.

Next, in process (3), the barrier layer 260 covering the organic EL element is formed. The barrier layer 260 is formed using a material and method similar to those of the barrier layer 60 of the first mode.

Finally, in process (4), by combining the second support member 210 on which are formed the organic EL element and barrier layer 260 with the color conversion filter, in a state in which the color conversion layer 40 and the barrier layer 260 are opposed, a top-emission type organic EL display is obtained. Combining of the second support member 210 and the color conversion filter can be performed for example by using an adhesive layer 310 provided on the peripheral portion of the transparent substrate 10 or the second support member 210 to bond the transparent substrate 10 and the second support member 210. The adhesive layer 310 can for example be manufactured using a UV-hardening adhesive or another arbitrary material known in the field. In this process, as an arbitrarily selected option, the internal space formed by the transparent substrate 10, second support member 210, and adhesive layer 310 may be packed with a packing material. From the standpoint of improving the light extraction efficiency, it is desirable that the packing material be a transparent resin material having a refractive index equal to or greater than that of the barrier layer 260. When using SiN, to form the barrier layer 260, it is desirable that a transparent resin material having a refractive index of 1.6 to 1.7 or above be used.

By means of the above method, a top-emission type organic EL display with active matrix driving can be obtained. Or, a practitioner of the art will understand that, by not providing the plurality of switching elements 220, forming the transparent electrode 230 from a plurality of stripe-shape partial electrodes extending in the second direction, and forming the reflective electrode 250 from a plurality of stripe-shape partial electrodes extending in the first direction, a top-emission type organic EL display with passive matrix driving can be obtained.

In an organic EL display manufactured by a method of this embodiment, there is constant efficiency in the series of processes in the color conversion layer 40 comprising absorption by the first dye, energy transfer from the first dye to the second dye, and light emission from the second dye. That is, the amount of light radiation from the second dye varies in proportion to the intensity of EL light. Hence an organic EL display manufactured by a method of this embodiment can emit light of a desired hue stably over a long period, even when there are changes in the driving voltage or changes in the intensity of EL light from the organic EL element accompanying increases in the time duration of current passage, because the emission intensity of converted light also changes to follow these changes.

Example 1

Color Conversion Filter

Color Mosaic CK-7001 (manufactured by Fuji Film Electronic Materials, Co., Ltd.) was applied onto 1737 glass (manufactured by Corning Inc.) 200 mm in length by 200 mm in width by 0.7 mm thick, and photolithography was used to form a black matrix having a plurality of rectangular openings. The black matrix had a film thickness of 1 μm. Each of the rectangular openings, equivalent to subpixels, was 131 μm in the length direction and 37 μm in the width direction, and the intervals between adjacent rectangular openings were 10 μm in both the length and width directions.

Next, Color Mosaic CK-7001 (manufactured by Fuji Film Electronic Materials, Co., Ltd.) was applied, and photolithography used, to form a red color filter layer comprising a plurality of stripe-shape portions extending in the length direction. Each of the plurality of stripe-shape portions was formed so as to overlap with portions of the adjacent black matrix extending in the length direction on both sides. Each of the plurality of stripe-shape portions had a film thickness of 1 µm and a width of 57 µm, and the portions were arranged at intervals of 84 µm.

Next, Color Mosaic CG-7001 (manufactured by Fuji Film Electronic Materials, Co., Ltd.) was applied, and photolithography used, to form a green color filter layer comprising a plurality of stripe-shape portions extending in the length direction. Each of the plurality of stripe-shape portions was formed so as to overlap with the adjacent black matrix portion extending in the length direction on one side, and with the adjacent layered member of the black matrix/red color filter layer on the opposite side. Each of the plurality of stripe-shape portions had a film thickness of 1 µm and a width of 57 µm, and the portions were arranged at intervals of 84 µm.

Next, Color Mosaic CB-7001 (manufactured by Fuji Film Electronic Materials, Co., Ltd.) was applied, and photolithography used, to form a blue color filter layer comprising a plurality of stripe-shape portions extending in the length direction. Each of the plurality of stripe-shape portions was formed so as to overlap with the adjacent layered member of the black matrix/red color filter layer and layered member of the black matrix/green color filter layer. Each of the plurality of stripe-shape portions had a film thickness of 1 µm and a width of 57 µm, and the portions were arranged at intervals of 84 µm.

Barrier walls formed by layering two types of color filter layers on portions of the black matrix extending in the length direction had a height of 2 µm, which was the difference between the total film thickness of the black matrix and two types of color filter layers, and the film thickness of the color filter layer formed in the adjacent rectangular opening.

The structure obtained had subpixels that were 141 µm in the length direction and 47 µm in the width direction, and had pixels, comprising subpixels in the three RGB colors, measuring 141 µm in the length direction and 141 µm in the width direction. This is equivalent to a resolution of 180 ppi.

Next, 1000 parts by weight of toluene were mixed with 50 parts by weight of a mixture of coumarin 6 which as the first dye and diethyl quinacridone (DEQ) as the second dye (with a molar ratio of coumarin 6:DEQ=48:2) to prepare ink. The ink thus prepared was loaded into an inkjet device. Next, in a nitrogen atmosphere, 42 pL of ink was caused to adhere per single green subpixel (three 14 pL liquid drops). Then, without changing the nitrogen environment, the color filter with ink adhering was moved into a vacuum drying furnace and was heated to 100° C. under a pressure of $1.0 \times 10^{-3}$ Pa to eliminate the toluene. The green color conversion layer obtained had a film thickness of 500 nm.

1000 parts by weight of toluene were mixed with 50 parts by weight of a mixture of coumarin 6 which as the first dye and DCM-2 as the second dye (with a molar ratio of coumarin 6:DCM-2=48:2) to prepare ink. The ink, thus prepared was loaded into an inkjet device. Next, in a nitrogen atmosphere, 42 pL of ink was caused to adhere per single red subpixel (three 14 pL liquid drops). Then, without changing the nitrogen environment, the color filter with ink adhering was moved into a vacuum drying furnace and was heated to 100° C. under a pressure of $1.0 \times 10^{-3}$ Pa to eliminate the toluene. The red color conversion layer obtained had a film thickness of 500 nm.

Then, without breaking vacuum, the color filter on which were formed a green color conversion layer and a red color conversion layer was moved into a plasma CVD device. Using the plasma CVD method, silicon nitride (SiN) was deposited to a film thickness of 1 µm to form a barrier layer, to obtain a color conversion filter. Here, monosilane ($SiH_4$), ammonia ($NH_3$), and nitrogen ($N_2$) were used as raw material gases. The temperature of the color filter during barrier layer formation was maintained at 100° C. or lower.

(Organic EL Display)

Initially, a sputtering method was used to deposit an IZO film of film thickness 200 nm over the entire upper face of the barrier layer. Next, the resist "TFR-1250" (manufactured by Tokyo Ohka Kogyo Co., Ltd.) was used to perform patterning using photolithography, and a transparent electrode was obtained comprising a plurality of stripe-shape partial electrodes, extending in the length direction and of width 39 µm, at positions equivalent to the respective subpixels. The gap between adjacent partial electrodes was 8 µm. In this example, the transparent electrode was an anode.

Next, the color conversion filter with transparent electrode formed was mounted in a resistive heating evaporation deposition device, and a hole injection layer, a hole transport layer, organic light-emitting layer, and electron injection/transport layer were deposited in sequence without breaking vacuum, to form the organic EL layer. When forming the layer, the pressure in vacuum vessel was reduced to $1 \times 10^{-4}$ Pa. The hole injection layer was copper phthalocyanine (CuPC) with a film thickness of 100 nm, the hole transport layer was 4,4'-bis[N-(1-naphthyl)-N-phenylamino]bisphenyl(α-NPD) of film thickness 20 nm, the light-emitting layer was 4,4'-bis(2,2'-diphenyl vinyl) biphenyl (DPVBi) of film thickness 30 nm, and the electron injection/transport layer was $Alq_3$ of film thickness 20 nm.

Next, without breaking the vacuum, a metal mask was used to deposit an Mg/Ag (weight ratio 10:1) film of film thickness 200 nm, to form the reflective electrode. The reflective electrode comprised a plurality of stripe-shape partial electrodes extending in the width direction. Each of the partial electrodes had a width of 131 µm, arranged at a pitch of 141 µm. In this example, the reflective electrode was the cathode.

The layered member obtained was sealed using a sealing gas and UV-hardening adhesive in a dry nitrogen atmosphere (with both the oxygen concentration and the water concentration at 10 ppm or less) in a glovebox, to obtain an organic EL display.

Example 2

Except for the fact that the film thickness of the black matrix was made 2 µm, the procedure of Example 1 was repeated to manufacture an organic EL display. In the intermediate structure of the color filter in this example, the barrier walls formed by layering two types of color filter layers in portions of the black matrix extending in the length direction each have a height of 3 µm.

Example 3

Except for the facts that the film thickness of the black matrix was made 2.5 µm, and that the film thickness of each of the color filter layers (R, G, B) was made 1.5 µm, the procedure of Example 1 was repeated to manufacture an organic EL display in the intermediate structure of the color filter in this example, the barrier walls formed by layering two types of color filter layers in portions of the black matrix extending in the length direction each have a height of 4 µm.

Comparative Example 1

Except for the facts that the width of the stripe-shape portions comprised by each of the color filter layers (R, G, B) was 37 µm, and that superposing of color filter layers on the black matrix was not performed, the procedure of Example 1 was repeated to manufacture an organic EL display. Barrier walls were not formed in the intermediate structure of the color filter in this example, and so the height was 0 μm.

Comparative Example 2

Except for the fact that formation of each of the color filter layers (R, G, B) was performed as described below, the procedure of Example 1 was repeated to manufacture an organic EL display.

Color Mosaic CR-7001 was applied and photolithography performed to form a red color filter layer, comprising a plurality of stripe-shape portions extending in the length direction. Each of the plurality of stripe-shape portions was formed so as to overlap only with the adjacent portion of the black matrix extending in the length direction on one side. Each of the plurality of stripe-shape portions had a film thickness of 1 μm and a width of 47 μm, and the portions were arranged at intervals of 94 μm.

Next, Color Mosaic CG-7001 was applied and photolithography performed to form a green color filter layer, comprising a plurality of stripe-shape portions extending in the length direction. Each of the plurality of stripe-shape portions was formed so as to overlap only with the adjacent portion of the black matrix extending in the length direction on one side. Each of the plurality of stripe-shape portions had a film thickness of 1 μm and a width of 47 μm, and the portions were arranged at intervals of 94 μm.

Next, Color Mosaic CB-7001 was applied and photolithography performed to form a blue color filter layer, comprising a plurality of stripe-shape portions extending in the length direction, to obtain a color filter. Each of the plurality of stripe-shape portions was formed so as to overlap only with the adjacent portion of the black matrix extending in the length direction on one side. Each of the plurality of stripe-shape portions had a film thickness of 1 μm and a width of 47 μm, and the portions were arranged at intervals of 94 μm.

In this comparative example, barrier walls were formed by layering one type of color filter layer in the portions of the black matrix extending in the length direction. The barrier walls formed each had a height of 1 μm.

Comparative Example 3

Except for the fact that the film thickness of each of the color filter layers (R, G, B) was made 0.5 μm, the procedure of Example 1 was repeated to manufacture an organic EL display. In the intermediate structure of the color filter in this example, she barrier walls formed by layering two types of color filter layers in portions of the black matrix extending in the length direction each have a height of 1.5 μm.

Example 4

Color Conversion Filter

Color Mosaic CK-7001 (manufactured by Fuji Film Electronic Materials, Co., Ltd.) was in a plurality of panel regions on non-alkali glass (Eagle 2000 manufactured by Corning Inc.) measuring 200 mm in length by 200 mm in width by 0.7 mm thick, and photolithography was used to form a black matrix having a plurality of rectangular openings. The black matrix had a film thickness of approximately 1.5 μm and a line width of approximately 16 μm (at the thinnest, portions). The rectangular openings were 180 μm in the length direction, arranged at a pitch of 60 μm in the width direction. This is equivalent to a resolution of 141 ppi.

Next, Color Mosaic CR-7001 (manufactured by Fuji Film Electronic Materials, Co., Ltd.) was applied and photolithography performed to form a red color filter layer, having the shape shown in FIG. 5. The layer was formed covering openings that were to become red subpixels, and overlapping the adjacent black matrix; the stripe-shape portions extending in the first direction had a width of approximately 68 μm. This portion had a film thickness of approximately 2 μm in the openings. Stripe-shape portions formed on the black matrix which became the boundaries between green subpixels and blue subpixels and which extended in the first direction, and stripe-shape portions formed on the black matrix which became the boundaries between subpixels of the same color and which extended in the second direction, each had a film thickness width of approximately 8 μm.

Next, Color Mosaic CG-7001 (manufactured by Fuji Film Electronic Materials, Co, Ltd.) was applied and photolithography performed to form a green color filter layer, having a shape similar to that of the red color filter layer, except for the positions of formation. And, Color Mosaic CB-7001 (manufactured by Fuji Film Electronic Materials, Co., Ltd.) was applied and photolithography performed to form a blue color filter layer, having a shape similar to that of the red color filter layer, except for the positions of formation.

In the above configuration, barrier walls having a width of approximately 8 μm, comprising a layered structure of red, green, and blue color filter layers, were formed on the black matrix, and bank structures separated for each subpixel were obtained. The total film thickness of the black matrix and the layered structure of the three types of color filter layers formed thereupon was approximately 6 μm, lower than the simple sum of 7.5 μm of the film thickness for each of the layers, due to a phenomenon in which the film thicknesses are reduced at the peaks of the protrusions (barrier wall formation sites). Hence the height of the barrier walls was approximately 4 μm in all portions. Heat treatment and UV irradiation treatment of the structure thus obtained comprising the black matrix and color filter layers were performed.

Next, 1000 parts by weight of toluene were mixed with 50 parts by weight of a mixture of coumarin 6 which as the first dye and diethyl quinacridone (DEQ) as the second dye (with a molar ratio of coumarin 6:DEQ=48:2) to prepare ink for green color conversion. The ink thus prepared was loaded into a multinozzle inkjet device, having an impact precision of approximately ±5 μm, in an environment set to an oxygen concentration of 5 ppm or less and water concentration of 5 ppm or less. Next, approximately 42 pL of ink (three drops of approximately 14 pL) were caused to adhere to the bank structures in green subpixels. Without changing the nitrogen environment, heating to 100° C. was performed, the toluene was eliminated, and a green color conversion layer was obtained. The green color conversion layer obtained had a film thickness of approximately 500 nm.

And, 1000 parts by weight of toluene were mixed with 50 parts by weight of a mixture of coumarin 6 which as the first dye and DCM-2 as the second dye (with a molar ratio of coumarin 6:DCM-2=48:2) to prepare ink for red color conversion. The prepared red color conversion ink was loaded into an inkjet device. Next, in a nitrogen atmosphere approximately 42 pL of ink (three drops of approximately 14 pL) were caused to adhere to the bank structures in one red subpixel. Without changing the nitrogen environment, heating to 100° C. was performed, the toluene was eliminated, and a red color conversion layer was obtained. The red color conversion layer obtained had a film thickness of approximately 500 nm.

Then, without changing the nitrogen environment, the structure with the green color conversion layer and red color conversion layer formed was moved into a plasma CVD device. Using plasma CVD, silicon nitride (SiN) was deposited to a film thickness of 2 μm to form the barrier layer. Then, using a photohardening resin (CR-600, manufactured by Hitachi Chemical Co., Ltd.), column-shape photospacers of diameter 10 μm and height approximately 5 μm were formed at intervals of approximately 180 μm on the barrier layer, at positions equivalent, to barrier walls, to obtain a color conversion filter.

(Organic EL Element)

A substrate was prepared in which TFTs for a plurality of panels and a flattening resin layer of film thickness 3 μm, covering the TFTs, were formed on non-alkali glass (Eagle 2000 manufactured by Corning Inc.) measuring 200 mm×200 mm and of thickness 0.7 mm. On the flattening resin layer of this substrate was deposited, using sputtering', a passivation layer comprising $SiO_2$ film of thickness approximately 300 nm. Next, dry etching was used to form contact holes in the flattening resin layer and passivation layer for connection of TFTs and the reflective electrode. Next, an RE planar magnetron sputtering device was used to deposit IZO to a film thickness of approximately 50 nm. Ar was used as the sputtering gas. A resist (OFRP-800, manufactured by Tokyo Ohka Kogyo Co., Ltd.) was used in photolithography to pattern the IZO film, forming an IZO base layer with subpixels separated into island shapes. The island-shape portions of the IZO base layer were each connected one-to-one with a TFT via a contact hole. Next, sputtering was used to form an Ag film of film thickness 100 nm, and then similar patterning was performed to form a reflective substrate comprising a plurality of island-shape portions. Each of the island-shape portions had dimensions of approximately 164 μm in the length direction by approximately 44 μm in the width direction, and were arranged at pitches of approximately 180 μm in the length direction and 60 μm in the width direction. Then, a spin coating method was used to apply a novolac system resin (JEM-700R2, manufactured by JSR) onto the reflective electrode, photolithography was performed to perform patterning, and an organic insulating film (not shown) of film thickness 1 μm, having openings at positions equivalent to light-emitting portions, was formed.

Next, the structure with the reflective electrode formed was mounted in a resistive heating evaporation deposition device, Li was deposited onto the reflective electrode to a film thickness of approximately 1.5 nm, and a cathode buffer layer was obtained. Then, the pressure within the vacuum chamber was reduced to $1\times10^{-4}$ Pa, and an electron transport layer comprising $Alq_3$ of film thickness approximately 20 nm, an organic light-emitting layer comprising DPVBi of film thickness approximately 30 nm, a hole transport layer comprising α-NPD of film thickness approximately 10 nm, and a hole injection layer comprising CuPc of film thickness approximately 100 nm, were deposited in sequence, and an organic EL layer was obtained. The film deposition rate for each layer was 0.1 nm/s. Further, a damage relaxation layer comprising MgAg of film thickness approximately 5 nm was deposited on the organic EL layer.

Next, the structure with damage relaxation layer formed was moved to a facing-target sputtering device without breaking the vacuum, and IZO was deposited to a film thickness of approximately 100 nm via a metal mask provided with openings at positions corresponding to display portions, to obtain a transparent electrode. The structure with transparent electrode formed was moved to a CVD device without breaking the vacuum, and $SiN_x$ was deposited to a film thickness of approximately 2 μm to form a barrier layer, so that an organic EL element was obtained.

(Organic EL Display)

The organic EL element and color conversion filter obtained as described above were moved, into a lamination device maintained at an environment with oxygen at 5 ppm and water at 5 ppm or less. Then, the process face of the color conversion filter, on which was formed the barrier layer, was set upwards, and a dispenser was used to seamlessly apply an epoxy system infrared hardening adhesive (XNR-5516, manufactured by Nagase ChemteX Corp.) to the peripheries of each of a plurality of panel regions, forming an adhesive layer. Then, as a packing material, a prescribed amount of a thermosetting epoxy adhesive (refractive index 1.58) was dripped near the center of each screen using a mechanical valve.

Next, with the process face, on which were formed the barrier layers of the organic EL elements, opposed to the color conversion filter process face, the organic EL elements were set in place. The pressure within the lamination device was reduced to approximately 10 Pa, she organic EL elements and the color conversion filters were brought to within distance of approximately 30 μm, the pixel positions thereof were aligned, and then a slight load was applied while returning the interior of the lamination device to atmospheric pressure. At this time, the organic EL elements and color conversion filters were brought together in opposition, and halted where the tips of the photospacers on the color conversion filters come into contact with the organic EL elements. At this time, the thermosetting epoxy adhesive dripped into the center of each screen spreads over the entire fare of each screen in the gap formed by the photospacers between the organic EL elements and she color conversion filters.

Next, only the adhesive layer was irradiated with ultraviolet light from the side of the color conversion filters to cause initial hardening, and the panels were removed into the general environment. Then, an automated glass scriber and breaking device was used to divide the individual panels. Each of the divided panels was heated for one hour at 80° C. in a heating furnace, and then naturally cooled for 30 minutes in the furnace.

Finally, dry etching was used to remove the battier layer formed at terminal regions for external connection of the organic EL elements, control ICs were bonded using an anisotropic conductive adhesive, and organic EL displays were obtained.

Evaluation

The organic EL displays manufactured in Examples 1 to 4 and Comparative Examples 1 to 3 were evaluated as to whether the color conversion layers were satisfactorily formed or not. Results appear in Table 1.

TABLE 1

Evaluation of the state of formation of color conversion layers

| | Barrier wall height (μm) | Color conversion layer formation state |
|---|---|---|
| Example 1 | 2 | Satisfactory |
| Example 2 | 3 | Satisfactory |
| Example 3 | 4 | Satisfactory |
| Comparative Example 1 | 0 | Unsatisfactory (mixed colors) |
| Comparative Example 2 | 1 | Unsatisfactory (mixed colors) |
| Comparative Example 3 | 1.5 | Unsatisfactory (mixed colors) |

In Comparative Examples 1 to 3, the barrier wall height was insufficient, and the ink used to form color conversion layers leaked into adjacent subpixels, causing mixed colors.

On the other hand, in Examples 1 to 3, having barrier wall heights of 2 μm or greater, red and green color conversion layers could be manufactured without color mixing occurring.

As described above, a novel method for manufacturing color conversion layers having high resolutions of 140 ppi or above, using an inkjet method, has been provided. This invention is promising for application to manufacture of various displays for which the development of display devices with increasingly higher resolutions has been demanded in recent years.

The invention claimed is:

1. A color conversion filter, comprising:
   a transparent substrate;
   a black matrix having a plurality of opening, on the transparent substrate;
   at least two types of color filter layers, the color filter layers transmitting light in different wavelength ranges; and
   a color conversion layer formed on at least one of the color filter layers, the color conversion layer being surrounded by a barrier wall in which at least two adjacent color filter layers on the black matrix are superposed, absorbing light of a specific wavelength and outputting light comprising a wavelength different from the absorbed wavelength.

2. The color conversion filter according to claim 1, wherein the barrier wall is formed by superposing three types of independently formed color filter layers.

3. The color conversion filter according to claim 2, wherein each of the three types of color filter layers has a first portion formed so as to cover an opening in the black matrix, and a second portion separated from the first portion and forming the wall.

4. An organic EL display having the color conversion filter according to claim 1.

5. An organic EL display having the color conversion filter according to claim 2.

6. An organic EL display having the color conversion filter according to claim 3.

7. An organic EL display comprising:
   a color conversion filter according to claim 1;
   a barrier layer on the color conversion filter;
   an organic EL element on the barrier wall,
   wherein the organic EL element includes a transparent electrode, an organic EL layer, and a reflective electrode in this order on the barrier layer.

8. An organic EL display comprising:
   a color conversion filter according to claim 2;
   a barrier layer on the color conversion filter;
   an organic EL element on the barrier wall,
   wherein the organic EL element includes a transparent electrode, an organic EL layer, and a reflective electrode in this order on the barrier layer.

9. An organic EL display comprising:
   a color conversion filter according to claim 3;
   a barrier layer on the color conversion filter;
   an organic EL element on the barrier wall,
   wherein the organic EL element includes a transparent electrode, an organic EL layer, and a reflective electrode in this order on the barrier layer.

10. An organic EL display comprising:
    a color conversion filter according to claim 1 on a first support member;
    an organic EL element on a second support member; and
    a barrier wall on the organic element,
    wherein the organic EL element includes a reflecting electrode, an organic EL layer, and a transparent electrode in this order on the second support member, and
    the organic element formed with the barrier layer is combined with the color conversion layer, with the barrier layer to be disposed, respectively opposite to each other.

11. An organic EL display comprising:
    a color conversion filter according to claim 2 on a first support member;
    an organic EL element on a second support member; and
    a barrier wall on the organic element,
    wherein the organic EL element includes a reflecting electrode, an organic EL layer, and a transparent electrode in this order on the second support member, and
    the organic element formed with the barrier layer is combined with the color conversion layer, with the barrier layer to be disposed respectively opposite to each other.

12. An organic EL display comprising:
    a color conversion filter according to claim 3 on a first support member;
    an organic EL element on a second support member; and
    a barrier wall on the organic element,
    wherein the organic EL element includes a reflecting electrode, an organic EL layer, and a transparent electrode in this order on the second support member, and
    the organic element formed with the harrier layer is combined with the color conversion layer, with the barrier layer to be disposed respectively opposite to each other.

* * * * *